United States Patent
Karakida

(10) Patent No.: US 9,330,986 B2
(45) Date of Patent: May 3, 2016

(54) MANUFACTURING METHOD FOR SOLAR CELL AND SOLAR CELL MANUFACTURING SYSTEM

(75) Inventor: Shoichi Karakida, Chiyoda-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 80 days.

(21) Appl. No.: 14/233,895

(22) PCT Filed: Aug. 2, 2011

(86) PCT No.: PCT/JP2011/067668
§ 371 (c)(1),
(2), (4) Date: Jan. 21, 2014

(87) PCT Pub. No.: WO2013/018194
PCT Pub. Date: Feb. 7, 2013

(65) Prior Publication Data
US 2014/0162383 A1    Jun. 12, 2014

(51) Int. Cl.
*H01L 21/00* (2006.01)
*H01L 21/66* (2006.01)
*H01L 31/0236* (2006.01)
(Continued)

(52) U.S. Cl.
CPC .......... *H01L 22/12* (2013.01); *H01L 31/02363* (2013.01); *H01L 31/068* (2013.01); *H01L 31/1804* (2013.01); *H01L 2924/0002* (2013.01); *Y02E 10/547* (2013.01); *Y02P 70/521* (2015.11)

(58) Field of Classification Search
None
See application file for complete search history.

(56) References Cited

U.S. PATENT DOCUMENTS 6,265,242 B1    7/2001    Komori et al.
8,129,212 B2    3/2012    Wijekoon et al.
(Continued)

FOREIGN PATENT DOCUMENTS

JP    10-40235 A    2/1998
JP    11-238897 A    8/1999
(Continued)

OTHER PUBLICATIONS

International Search Report (PCT/ISA/210) mailed on Aug. 30, 2011, by the Japanese Patent Office as the International Searching Authority for International Application No. PCT/JP2011/067668.
(Continued)

*Primary Examiner* — Calvin Choi
(74) *Attorney, Agent, or Firm* — Buchanan Ingersoll & Rooney PC

(57) ABSTRACT

The invention includes: a first process of forming a texture structure on both surfaces of a semiconductor substrate of a first conductivity type; a second process of measuring a reflectance distribution of the both surfaces of the semiconductor substrate on which the texture structure is formed; a third process of forming an impurity diffusion layer, in which an impurity element of a second conductivity type is diffused, on one of the both surfaces of the semiconductor substrate which is narrower in the reflectance distribution; a fourth process of forming, on the impurity diffusion layer, a light receiving surface-side electrode having a predetermined pattern and electrically connected to the impurity diffusion layer; and a fifth process of forming a back surface-side electrode on another of the both surfaces of the semiconductor substrate which is wider in the reflectance distribution.

12 Claims, 10 Drawing Sheets

(51) Int. Cl.
  *H01L 31/068* (2012.01)
  *H01L 31/18* (2006.01)
  *G01R 31/26* (2014.01)

(56) References Cited

U.S. PATENT DOCUMENTS

| | | | | |
|---|---|---|---|---|
| 2005/0007364 A1* | 1/2005 | Oyama et al. | ............ | 345/428 |
| 2005/0126627 A1* | 6/2005 | Hayashida | ............ | 136/257 |
| 2009/0280597 A1* | 11/2009 | Wijekoon et al. | ............ | 438/71 |
| 2011/0108108 A1* | 5/2011 | Im et al. | ............ | 136/258 |

FOREIGN PATENT DOCUMENTS

| | | |
|---|---|---|
| JP | 2001-343332 A | 12/2001 |
| JP | 2005-150614 A | 6/2005 |
| JP | 2011-515872 A | 5/2011 |
| JP | 2011-155228 A | 8/2011 |

OTHER PUBLICATIONS

Written Opinion (PCT/ISA/237) mailed on Aug. 30, 2011, by the Japanese Patent Office as the International Searching Authority for International Application No. PCT/JP2011/067668.

* cited by examiner

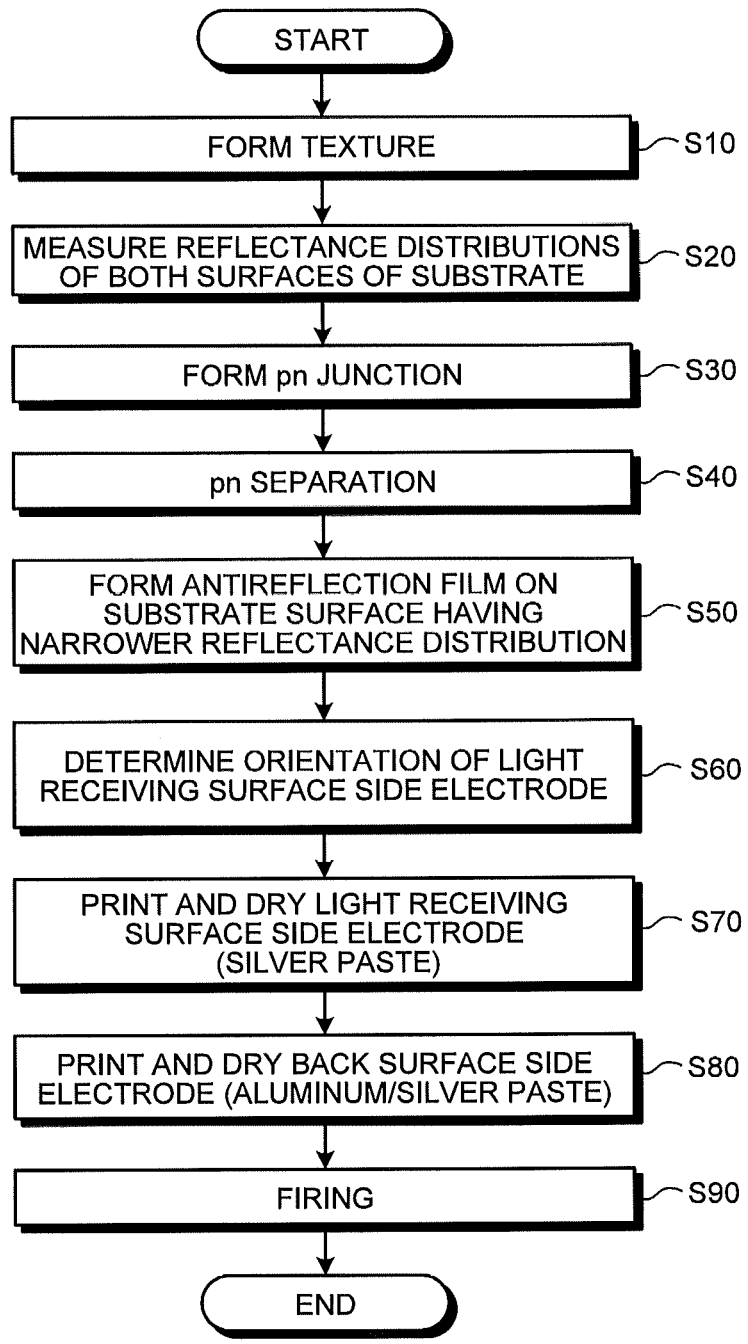

MANUFACTURING METHOD FOR SOLAR CELL AND SOLAR CELL MANUFACTURING SYSTEM

FIELD

The present invention relates to a manufacturing method for a solar cell and a solar cell manufacturing system and, more particularly, to a manufacturing method and a manufacturing system for a solar cell having an excellent appearance.

BACKGROUND

In general, a bulk type solar cell has been manufactured by the following method. First, a p-type silicon substrate as an example of a substrate of a first conductivity type is prepared. Then, a damage layer on a silicon surface that is caused when being sliced from a casted ingot is removed by a thickness of 10 to 20 micrometers by using caustic soda or sodium caustic soda of several to 20 wt % for example. After that, anisotropic etching is performed by using solution obtained by adding IPA (isopropyl alcohol) to similar low concentration alkaline solution, and thereby a texture is formed such that a silicon (111) surface is exposed.

Subsequently, treatment is performed, for example, at a temperature of 800 to 900 degrees centigrade for several tens of minutes in an atmosphere of a mixed gas of phosphorous oxychloride ($POCL_3$), nitrogen and oxygen, and thereby an n-type layer as an impurity layer of a second conductivity type is uniformly formed on an entire surface of the p-type silicon substrate. Excellent electric characteristics of a solar cell can be obtained by setting a sheet resistance of the n-type layer formed uniformly on the surface of the p-type silicon substrate to about 30 to 80 $\Omega$/square. Here, since the n-type layer is uniformly formed on the surface of the p-type silicon substrate, a front surface and a back surface of the p-type silicon substrate are in an electrically connected state. In order to cut off the electrical connection, an edge region of the p-type silicon substrate is removed by dry etching to expose the p-type silicon. As another method for eliminating influence of the n-type layer, the edge region may be cut off by using laser. After that, the substrate is immersed into a hydrofluoric acid aqueous solution to etch and remove glassy material (PSG) that has been deposited on the surface during the diffusion treatment.

Next, an insulating film such as a silicon oxide film, a silicon nitride film and a titanium oxide film is formed as an insulating film intended to antireflection (i.e. an antireflection film) with a uniform thickness on a surface of the n-type layer on a light receiving surface-side. In a case where a silicon nitride film is used as the antireflection film, the silicon nitride film can be formed, for example, by performing a low-pressure plasma CVD method using $SiH_4$ gas and $NH_3$ gas as raw material gas under a condition of a temperature of 300 degrees centigrade or higher. The refractive index of the antireflection film is about 2.0 to 2.2. An optimum thickness of the antireflection film is about 70 to 90 nanometers. It should be noted that the antireflection film thus formed is an insulator and just forming a light receiving surface-side electrode on the antireflection film is not enough for achieving an action of a solar cell.

Next, silver paste as a material of a light receiving surface-side electrode is applied by a screen printing method on the antireflection film in a shape of grid electrodes and bus electrodes, by using a mask for forming the grid electrodes and the bus electrodes. Then, the applied paste is dried.

Next, back aluminum electrode paste as a material of a back aluminum electrode and back silver paste as a material of a back silver bus electrode are applied by a screen printing method on the back surface of the substrate in shapes of the back aluminum electrode and the back silver bus electrode, respectively. Then, the applied paste is dried.

Next, the electrode paste applied on the front and back surfaces of the p-type silicon substrate is concurrently fired for several minutes at a temperature of about 600 to 900 degrees centigrade. As a result, the grid electrodes and the bus electrodes are formed as the light receiving surface-side electrode on the antireflection film, and the back aluminum electrode and the back silver bus electrode are formed as a back surface-side electrode on the back surface of the p-type silicon substrate. At this time, on the side of the front surface of the p-type silicon substrate, the antireflection film is melted due to glassy material included in the silver paste, thereby the silver material comes in contact with the silicon and then coagulates again. As a result, electrical connection between the light receiving surface-side electrode and the silicon substrate (the n-type layer) is established. Such the process is called a fire-through method. Moreover, the back aluminum electrode paste reacts with the back surface of the silicon substrate, and thereby a p+ layer is formed immediately under the back aluminum electrode.

An excellent appearance as well as a power generation characteristic is required for the solar cell manufactured in this manner. As an example of a method for improving an appearance of a solar cell module, the following method is proposed. That is, a plurality of solar cells are classified based on tone, and variation in the appearance of the solar cell module as a whole is suppressed by mixing solar cells having different tones (refer to Patent Literature 1, for example).

CITATION LIST

Patent Literature

Patent Literature 1: Japanese Patent Application Laid-Open No. H11-238897

SUMMARY

Technical Problem

However, the above-mentioned Patent Literature 1 is a technique for suppressing the variation in the appearance of the solar cell module as a whole by mixing solar cells having different tones, and cannot improve an appearance of a single solar cell. In the manufacture of the solar cell, an appearance inspection is performed with respect to each solar cell, after the solar cell is manufactured. A solar cell which does not satisfy a desired appearance quality is determined to be defective and excluded from products, which causes deterioration in yield and is a problem.

For improving the appearance quality of the solar cell, it is desirable that the texture on the light receiving surface-side is formed beautifully and uniformly. If there is a region where the texture is not formed or a formation density of the texture is lower as compared with other regions, on the light receiving surface-side of the solar cell, the appearance of the solar cell is deteriorated depending on a frequency of occurrence of such the region. That is, a region in which a formation state of the texture is different from that in other regions has a different reflectance and thus appears in a different color. Such the influence of the quality (formation state) of the texture on the appearance is more serious in a case of a single-crystalline silicon solar cell having a single crystal orientation than in a case of a polycrystalline silicon solar cell having various crystal orientations.

In a case where the texture is formed on a polycrystalline silicon substrate, an etching speed varies depending on a plane orientation of silicon, variation in the texture shape is caused, and an appearance is slightly deteriorated due to the variation in the texture shape. Therefore, in the case of the polycrystalline silicon solar cell, even if there is somewhat the above-mentioned unevenness in the formation state of the texture on the surface of the substrate after the texture formation, the unevenness is inconspicuous.

Besides the process of forming the texture, a process of forming an antireflection film also is one of representative processes that cause deterioration in the appearance of the solar cell. The tone of the light receiving surface-side of the solar cell varies depending on a film thickness of the antireflection film. Therefore, if there is a region where the antireflection film is not formed or the film thickness of the antireflection film differs from those of other regions, on the light receiving surface-side of the solar cell, the appearance of the solar cell is deteriorated depending on a frequency of occurrence of such the region.

There are the following two major causes of the occurrence of such the region. The first one is that the antireflection film is thickly deposited on a region (e.g. a wall of a deposition apparatus) other than the surface of the substrate during deposition of the antireflection film and then the deposited material falls off onto the surface of the substrate during the deposition. In this case, the fall-off film interferes the film deposition and thus a region where the antireflection film is not formed is caused. The second one is film deposition failure due to abnormality of plasma discharge in a case where the antireflection film is formed by the plasma CVD, for example.

At present, however, no effective measure against the above-mentioned deterioration in the yield caused by the defective appearance has been established.

The present invention has been achieved in view of the above, and it is an object of the present invention to provide a manufacturing method and a manufacturing system for a solar cell having an excellent appearance.

Solution to Problem

In order to solve the above-mentioned problems and achieve the above-mentioned object, a manufacturing method for a solar cell according to the present invention includes: a first process of forming a texture structure on both surfaces of a semiconductor substrate of a first conductivity type; a second process of measuring a reflectance distribution of the both surfaces of the semiconductor substrate on which the texture structure is formed; a third process of forming an impurity diffusion layer, in which an impurity element of a second conductivity type is diffused, on one of the both surfaces of the semiconductor substrate which is narrower in the reflectance distribution; a fourth process of forming, on the impurity diffusion layer, a light receiving surface-side electrode having a predetermined pattern and electrically connected to the impurity diffusion layer; and a fifth process of forming a back surface-side electrode on another of the both surfaces of the semiconductor substrate which is wider in the reflectance distribution.

Advantageous Effects of Invention

According to the present invention, it is possible to reduce an occurrence rate of a defective appearance and thus to manufacture a solar cell having an excellent appearance.

BRIEF DESCRIPTION OF DRAWINGS

FIG. 1-2 is a diagram for explaining the configuration of the solar cell according to the first embodiment of the present invention and is a bottom view of the solar cell viewed from the opposite side of the light receiving surface.

FIG. 1-3 is a diagram for explaining the configuration of the solar cell according to the first embodiment of the present invention and is a main part sectional view taken along a line A-A in FIG. 1-2.

FIG. 2 is a flowchart for explaining an example of a manufacturing process for a solar cell according to the embodiment of the present invention.

FIG. 3-1 is a sectional view for explaining the example of the manufacturing process for the solar cell according to the embodiment of the present invention.

FIG. 3-2 is a sectional view for explaining the example of the manufacturing process for the solar cell according to the embodiment of the present invention.

FIG. 3-3 is a sectional view for explaining the example of the manufacturing process for the solar cell according to the embodiment of the present invention.

FIG. 3-4 is a sectional view for explaining the example of the manufacturing process for the solar cell according to the embodiment of the present invention.

FIG. 3-5 is a sectional view for explaining the example of the manufacturing process for the solar cell according to the embodiment of the present invention.

FIG. 3-6 is a sectional view for explaining the example of the manufacturing process for the solar cell according to the embodiment of the present invention.

FIG. 3-7 is a sectional view for explaining the example of the manufacturing process for the solar cell according to the embodiment of the present invention.

FIG. 4-1 is a plan view of a state on one surface-side of a p-type single-crystalline silicon substrate after formation of a texture structure.

FIG. 4-2 is a plan view showing a state on the other surface-side of the p-type single-crystalline silicon substrate after the formation of the texture structure.

FIG. 5 is a processed image on the light receiving surface-side of the p-type single-crystalline silicon substrate after formation of an antireflection film, subjected to image processing by a color sensor.

FIG. 6 is a simulation diagram of an orientation of a light receiving surface-side electrode on the antireflection film, generated by the image processing.

FIG. 7 is a simulation diagram of an orientation of the light receiving surface-side electrode on the antireflection film, generated by the image processing.

DESCRIPTION OF EMBODIMENT

Figure 1:
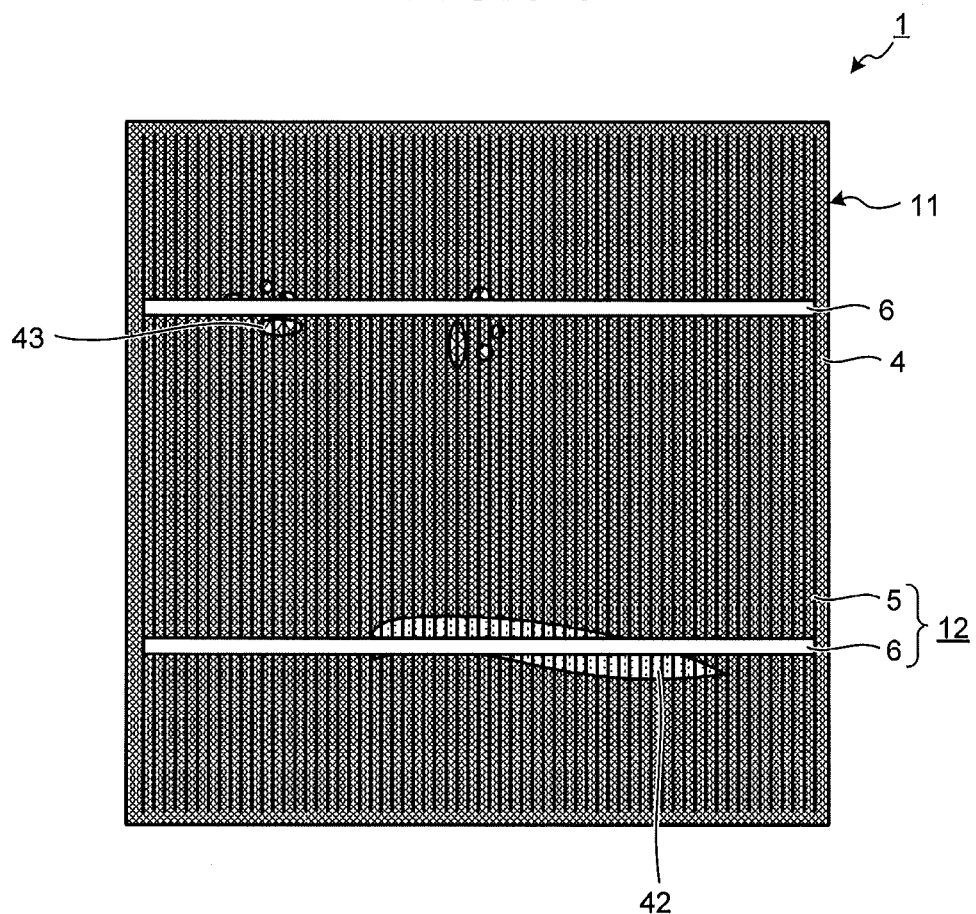
FIG. 1-1 is a diagram for explaining a configuration of a solar cell according to a first embodiment of the present invention and is a top view of the solar cell viewed from a light receiving surface-side.

An embodiment of a manufacturing method for a solar cell and a solar cell manufacturing system according to the present invention will be described below with reference to the drawings. Note that the present invention is not limited to the following description and can be modified as appropriate without departing from the spirit of the present invention. In the drawings referred to below, for easiness of understanding, scales of respective members may be different from actual scales. The same applies to among the drawings. Hatching is sometimes applied to even a plan view to make it easy to see the drawing.

Embodiment

Figures 1, 2:
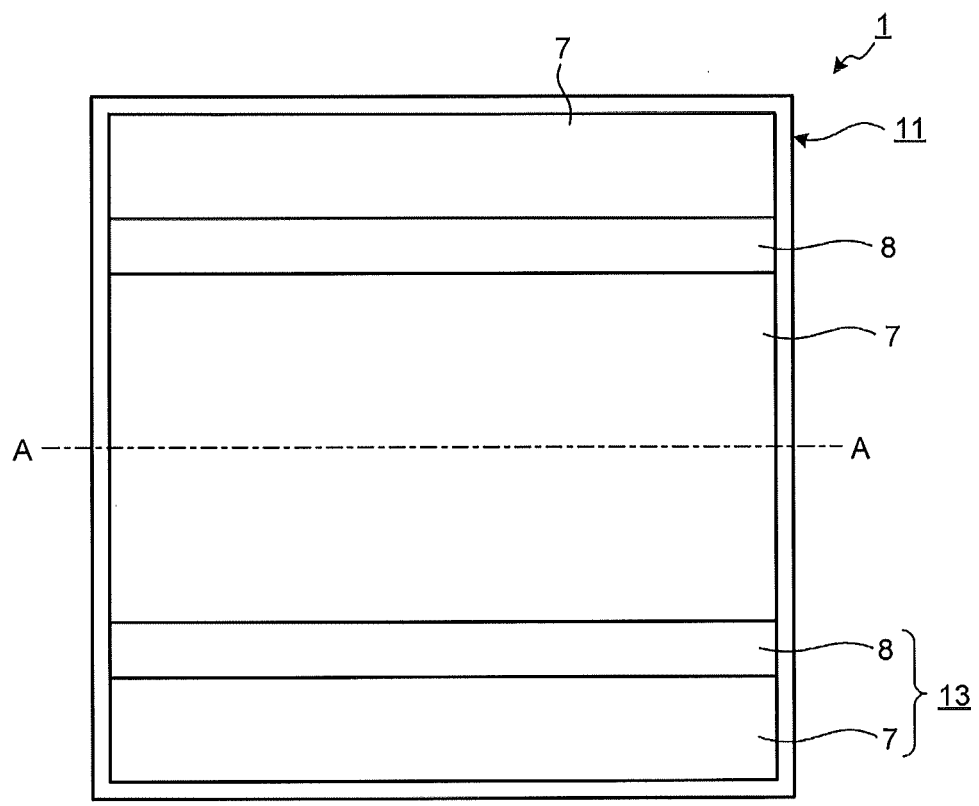
Figures 1, 2, 3:
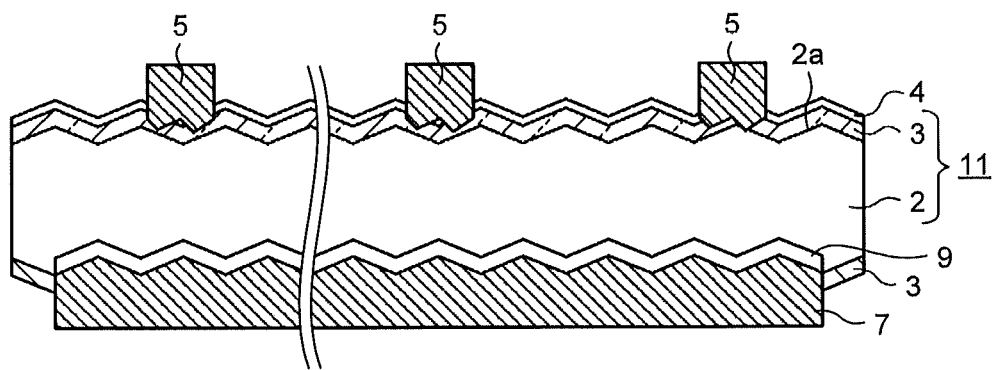

FIGS. 1-1 to 1-3 are diagrams for explaining a configuration of a solar cell 1 according to an embodiment of the present invention. FIG. 1-1 is a top view of the solar cell 1 viewed from a light receiving surface-side. FIG. 1-2 is a bottom view of the solar cell 1 viewed from the opposite side of the light receiving surface. FIG. 1-3 is a main part sectional view of the solar cell 1 taken along a line A-A in FIG. 1-2.

In the solar cell 1 according to the present embodiment, an n-type impurity diffusion layer 3 is formed by phosphor diffusion into the light receiving surface-side of a semiconductor substrate 2 made of p-type single-crystalline silicon, and thereby a semiconductor substrate 11 having a pn junction is formed. An antireflection film 4 made of a silicon nitride film (an SiN film) is formed on the n-type impurity diffusion layer 3. It should be noted that the semiconductor substrate 2 is not limited to the p-type single-crystalline silicon substrate, and a p-type polycrystalline silicon substrate, an n-type polycrystalline silicon substrate, or an n-type single-crystalline silicon substrate may be used instead.

Moreover, microasperity as a texture structure is formed on the light receiving surface-side surface of the semiconductor substrate 11 (the n-type impurity diffusion layer 3). The microasperity has such a structure that increases an external light absorption area of the light receiving surface, suppresses reflectance at the light receiving surface and confines light.

The antireflection film 4 is made of a silicon nitride film (SiN film) being an insulating film. The antireflection film 4 made of the silicon nitride film (SiN film) takes on bluish color. It should be noted that the antireflection film 4 is not limited to the silicon nitride film (SiN film) and may be formed of an insulating film such as a silicon oxide film ($SiO_2$ film) and a titanium oxide film ($TiO_2$) film.

Moreover, a plurality of elongated front silver grid electrodes 5 are provided side by side on the light receiving surface-side of the semiconductor substrate 11. Front silver bus electrodes 6 electrically connected to the front silver grid electrodes 5 are provided substantially orthogonal to the front silver grid substrates 5. Respective bottom surface portions of the electrodes are electrically connected to the n-type impurity diffusion layer 3. The front silver grid electrodes 5 and the front silver bus electrodes 6 are made of a silver material.

The front silver grid electrodes 5 each has a width of about 100 to 200 micrometers and are arranged substantially parallel to each other at an interval of about 2 millimeters, for example. The front silver grid electrodes 5 collect electricity generated within the semiconductor substrate 11. The front silver bus electrodes 6 each has a width of about 1 to 3 millimeters and two or three pieces of the silver bus electrode 6 are provided per one solar cell 1, for example. The front silver bus electrodes 6 extract the electricity collected by the front silver grid electrodes 5 to the outside. Such the front silver grid electrodes 5 and front silver bus electrodes 6 form a light receiving surface-side electrode 12 which is a first electrode having a comb shape. Since the light receiving surface-side electrode 12 blocks solar light incident on the semiconductor substrate 11, it is preferable in terms of improvement of power generation efficiency to design an area of the light receiving surface-side electrode 12 as small as possible. In general, the front silver grid electrodes 5 having a comb shape and the front silver bus electrodes 6 having a bar shape are arranged as shown in FIG. 1-1.

In general, silver paste is used as an electrode material of the light receiving surface-side electrode of the silicon solar cell. For example, lead boron glass is added to the silver paste. The glass is flit-like glass and consists of a composition of, for example, 5 to 30 wt % of lead (Pb), 5 to 10 wt % of boron (B), 5 to 15 wt % of silicon (Si), and 30 to 60 wt % of oxygen (O). In some cases, several wt % of zinc (Zn), cadmium (Cd) or the like may be further mixed. Such the lead boron glass has a characteristic of being melted with heat of several hundred degrees centigrade (e.g. 800 degrees centigrade) and thereby eroding silicon. In general, a manufacturing method for a silicon crystal type solar cell employs a method of establishing an electrical contact between the silicon substrate and the silver paste by the use of the characteristic of the glass flit.

On the other hand, a back aluminum electrode 7 made of an aluminum material is provided on an entire back surface (a surface on the opposite side of the light receiving surface) of the semiconductor substrate 11, excluding a part of an outer edge region. Moreover, a back silver electrode 8 made of a silver material is provided to extend in substantially the same direction as the front silver bus electrode 6. Such the back aluminum electrode 7 and back silver electrode 8 form a back surface-side electrode 13 which is a second electrode. The back aluminum electrode 7 is also expected to exhibit a BSR (Back Surface Reflection) effect that reflects a long wavelength light passing through the semiconductor substrate 11 to be reused for power generation.

Furthermore, a p+ layer (BSF (Back Surface Field)) 9 including high-concentration impurities is formed on a surface layer of the back surface (the surface on the opposite side of the light receiving surface) of the semiconductor substrate 11. The p+ layer (BSF) 9 is provided for obtaining the BSF effect. Electron concentration in the p-type layer (semiconductor substrate 2) is increased by an electric field of a band structure in order to prevent electrons in the p-type layer (the semiconductor substrate 2) from disappearing.

In the solar cell 1 thus configured, holes and electrons are generated when solar light enters from the light receiving surface-side of the solar cell 1 to the pn junction interface (an interface between the semiconductor substrate 2 and the n-type impurity diffusion layer 3) of the semiconductor substrate 11. The generated electrons and holes move toward the n-type impurity diffusion layer 3 and the p+ layer 9, respectively, by an electric field at the pn junction. Accordingly, electrons are excessively present in the n-type impurity diffusion layer 3 and holes are excessively present in the $p_+$ layer 9, which results in generation of photovoltaic power. The photovoltaic power is generated to forward bias the pn junction. The light receiving surface-side electrode 12 connected to the n-type impurity diffusion layer 3 serves as a negative electrode, the back aluminum electrode 7 connected to the p+ layer 9 serves as a positive electrode, and thereby an electric current flows to an external circuit not shown.

Regarding the solar cell, it is difficult to uniformly form the texture over an entire surface on the light receiving surface-side of the semiconductor substrate (the n-type impurity diffusion layer). It is also difficult to form the antireflection film with a uniform thickness over an entire surface on the light receiving surface-side of the semiconductor substrate (the n-type impurity diffusion layer). Therefore, variation in an appearance of the solar cell is caused by unevenness of the texture and unevenness of the thickness of the antireflection film on the light receiving surface-side of the solar cell.

For example, when the solar cell 1 according to the present embodiment is viewed from the light receiving surface-side, an defective appearance region 42 and an defective appearance region 43 appear as a patchy pattern. The defective appearance region 42 is, for example, a region where the texture is not formed or a formation density of the texture is lower as compared with other regions on the light receiving surface-side of the semiconductor substrate 11 (the n-type impurity diffusion layer 3). In other words, the defective appearance region 42 is a defective appearance region that is attributed to a formation state of the texture structure. The defective appearance region 43 is, for example, a region where the antireflection film 4 is not formed or a film thickness of the antireflection film 4 is different from that in other regions. In other words, the defective appearance region 43 is a defective appearance region that is attributed to a formation state of the antireflection film 4.

When the antireflection film 4 made of the silicon nitride film (SiN film) is viewed from the light receiving surface-side, the antireflection film 4 appears to be dark bluish color. However, tone or color appears to be different at the defective appearance region 42 and the defective appearance region 43. In the case of the solar cell 1, the defective appearance region 43 appears to be paler in bluish color as compared with the dark bluish color of the antireflection film 4 in other regions. The defective appearance region 42 becomes further paler in color than the defective appearance region 43 and appears to be whitish color. In this manner, the variation in appearance tends to occur on the light receiving surface-side of the solar cell.

However, the solar cell 1 is manufactured with reducing a visible area of the defective appearance region such as the defective appearance region 42 and the defective appearance region 43 on the light receiving surface-side. Therefore, according to the present embodiment, the solar cell 1 having an excellent appearance can be achieved.

A method of manufacturing the solar cell 1 according to the present embodiment will be described below with reference to the drawings. FIG. 2 is a flowchart for explaining an example of a manufacturing process for the solar cell 1 according to the embodiment of the present invention. FIGS. 3-1 to 3-7 are sectional views for explaining the example of the manufacturing process for the solar cell 1 according to the embodiment of the present invention.

First, a p-type single-crystalline silicon substrate having a thickness of several hundreds of micrometers, for example, is prepared as a semiconductor substrate 2 (FIG. 3-1). Since the p-type single-crystalline silicon substrate is fabricated by slicing, by using a wire saw, an ingot obtained by cooling and solidifying melted silicon, damage during the slicing remains on the surface of the p-type single-crystalline silicon substrate. Therefore, etching of the surface is performed by immersing the p-type single-crystalline silicon substrate in acid solution or heated alkali solution, for example, sodium hydroxide solution to remove the damage region that is generated during the slicing of the silicon substrate and present near the surface of the p-type single-crystalline silicon substrate. For example, the surface is removed by a thickness of 10 to 20 micrometers by using caustic soda or sodium caustic soda of several to 20 wt %.

Subsequent to the damage removal, anisotropic etching of the p-type single-crystalline silicon substrate is performed by using solution obtained by adding IPA (isopropyl alcohol) to similar low concentration alkaline solution. Here, microasperity (texture) is formed on the surface on the light receiving surface-side of the p-type single-crystalline silicon substrate such that a silicon (111) surface is exposed, and thus a texture structure 2a is formed (Step S10, FIG. 3-2). By providing such the texture structure 2a on the light receiving surface-side of the p-type single-crystalline silicon substrate, it is possible to cause multiple reflection of light on the front surface-side of the solar cell 1, efficiently absorb the light incident on the solar cell 1 into the semiconductor substrate 11, effectively reduce reflectance and thus improve conversion efficiency. When the removal of the damage layer and the formation of the texture structure are performed by using the alkaline solution, the treatments may be performed sequentially by adjusting the concentration of the alkaline solution to concentrations corresponding to respective purposes.

Figures 1, 3:
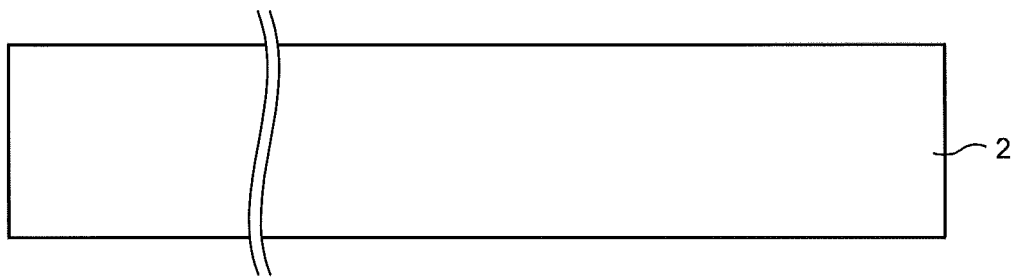
Figures 2, 3:
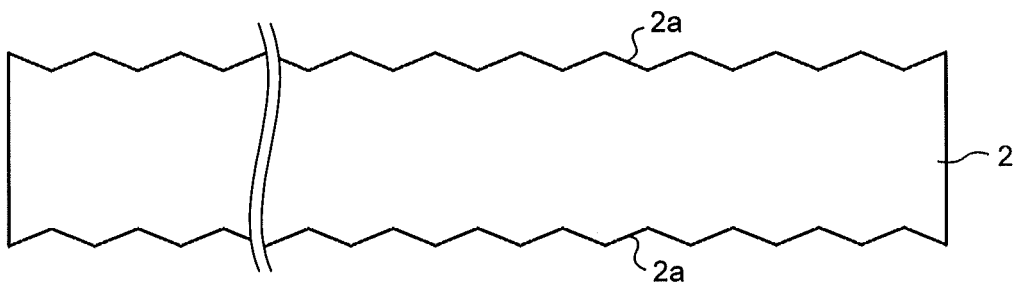
Figure 3:
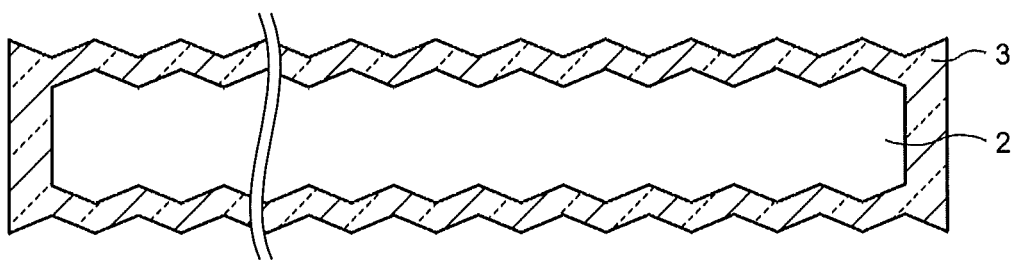
Figures 3, 4:
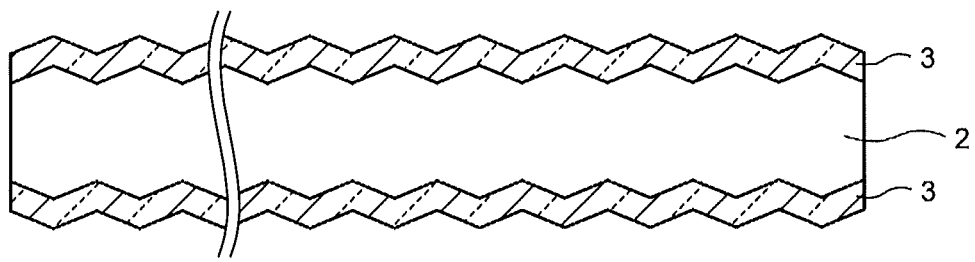

FIGS. 4-1 and 4-2 are plan views showing an example of states of both surfaces of the p-type single-crystalline silicon substrate after the formation of the texture structure 2a. FIG. 4-1 is a plan view showing the state of one surface-side of the p-type singe crystal silicon substrate. FIG. 4-2 is a plan view showing the state of the other surface-side of the p-type single-crystalline silicon substrate.

The following can be observed from the both surfaces of the p-type single-crystalline silicon substrate on which the texture structure 2a is formed. On the other surface-side of the p-type single-crystalline silicon substrate, not entire surface has the uniformly-formed texture structure 2a and thus reflectance is non-uniform on the surface, which results is a patchy pattern in appearance. That is, on the other surface-side of the p-type single-crystalline silicon substrate, as shown in FIG. 4-2, two types of defective appearance regions 32 and 33 which are different from a good appearance region 31 are formed within the good appearance region 31. The good appearance region 31 is a region where the texture structure 2a is formed substantially uniformly. The defective appearance region 32 and the defective appearance region 33 correspond to a region where the texture is not formed or a formation density of the texture is lower as compared with the good appearance region 31.

Meanwhile, on the one surface-side of the p-type single-crystalline silicon substrate on which the texture structure 2a is formed, not entire surface has the uniformly-formed texture and thus reflectance is non-uniform on the surface, which results is a certain pattern in appearance. That is, on the one surface-side of the p-type single-crystalline silicon substrate, a defective appearance region 22 which is different from a good appearance region 21 is formed within the good appearance region 21. The good appearance region 21 is a region where the texture is formed substantially uniformly. The defective appearance region 22 is a defective texture structure formation region where the texture is not formed or a formation density of the texture is lower as compared with the good appearance region 21.

In this manner, it is rare that the texture structure 2a of completely the same quality is formed on both of the front and back surfaces of the silicon substrate. In the case of the solar cell, the surface (back surface) opposite to the light-receiving surface has no impact on the appearance, because the electrode is formed on almost entire of the back surface. Therefore, by using, as the back surface, a surface having a worse appearance after the formation of the texture structure, it is possible to reduce an occurrence rate of the defective appearance of the solar cell.

Therefore, according to the present embodiment, which surface of the p-type single-crystalline silicon substrate is used as the light receiving surface or the back surface is determined after the formation of the texture structure 2a, and a surface having a worse appearance is set as the back surface.

That is, according to the present embodiment, reflectance distributions of both surfaces of the p-type single-crystalline silicon substrate on which the texture structure 2a is formed are measured, and which surface of the p-type single-crystalline silicon substrate is used as the light receiving surface or the back surface is determined based on the measured reflectance distributions (Step S20).

In order to measure the reflectance distribution, for example, reflectance with respect to a light of a wavelength of 700 nanometers is measured, by using a reflectance measurement device, at a large number of points on both surfaces of the p-type single-crystalline silicon substrate on which the texture structure 2a is formed. For example, the reflectance is measured at respective equivalent twenty-five points for each of the both surfaces of the p-type single-crystalline silicon substrate.

Next, respective reflectance distributions of both surfaces of the p-type single-crystalline silicon substrate are calculated to determine the light receiving surface. For example, the reflectance measurement device is provided with a calculation and determination unit. The calculation and determination unit calculates, based on data of the measured reflectance, an index of variation such as a standard deviation of the reflectance of each surface of the p-type single-crystalline silicon substrate. Then, based on spreads (widths) of the respective reflectance distributions of both surfaces of the p-type single-crystalline silicon substrate, the calculation and determination unit determines, as the light receiving surface, a surface whose reflectance distribution is relatively narrower in width (e.g. standard deviation).

In the present embodiment, the width (e.g. standard deviation) of the reflectance distribution is smaller on the one surface-side of the p-type single-crystalline silicon substrate shown in FIG. 4-1 than on the other surface-side of the p-type single-crystalline silicon substrate shown in FIG. 4-2. Therefore, the calculation and determination unit determines, as the light receiving surface, the one surface-side of the p-type single-crystalline silicon substrate shown in FIG. 4-1. Also, the calculation and determination unit determines, as the back surface, the other surface-side of the p-type single-crystalline silicon substrate shown in FIG. 4-2 whose reflectance distribution is relatively wider in width (e.g. standard deviation). It should be noted that although the number of reflectance measurement points is not limited in particular, a larger number of measurement points is more preferable for obtaining more precise reflectance distribution.

Next, a pn junction is formed in the semiconductor substrate 2 (Step S30, FIG. 3-3). That is, a group V element such as phosphorus (P) is diffused into the semiconductor substrate 2 to form a n-type impurity diffusion layer 3 of a thickness of several hundreds of nanometers. In the present example, the pn junction is formed by thermally diffusing phosphorous oxychloride ($POCL_3$) into the p-type single-crystalline silicon substrate on both surfaces of which the texture structure 2a is formed. As a result, the n-type impurity diffusion layer 3 is formed on the entire surface of the p-type single-crystalline silicon substrate.

In this diffusion process, for example, the p-type single-crystalline silicon substrate is subjected to thermal diffusion by a gas phase diffusion method at a high temperature of 800 to 900 degrees centigrade for several ten minutes in a mixed gas atmosphere of phosphorous oxychloride ($POCL_3$) gas, nitride gas and oxide gas to uniformly form the n-type impurity diffusion layer 3 where phosphorous (P) is diffused in a surface layer of the p-type single-crystalline silicon substrate. An excellent electric characteristic of the solar cell is obtained when a sheet resistance of the n-type impurity diffusion layer 3 formed on the surface of the semiconductor substrate 2 is in about a rage of 30 Ω/square to 80 Ω/square.

Next, pn separation is performed for electrically insulating between the back surface-side electrode 13 being a p-type electrode and the light receiving surface-side electrode 12 being an n-type electrode (Step S40, FIG. 3-4). Since the n-type impurity diffusion layer 3 is uniformly formed on the surface of the p-type single-crystalline silicon substrate, the front surface and the back surface are in an electrically connected state. Therefore, if the back surface-side electrode 13 (the p-type electrode) and the light receiving surface-side electrode 12 (the n-type electrode) are formed, the back surface-side electrode 13 (the p-type electrode) and the light receiving surface-side electrode 12 (the n-type electrode) are electrically connected to each other. In order to prevent such the electrical connection, the n-type impurity diffusion layer 3 formed on an edge region of the p-type single-crystalline silicon substrate is removed by dry etching to achieve the pn separation. As another method for eliminating influence of the n-type impurity diffusion layer 3, the edge region may be cut off by using laser.

Here, a glassy material (Phospho-Silicate glass: PSG) layer deposited during the diffusion treatment is formed on the surface of the p-type single-crystalline silicon substrate, immediately after the formation of the n-type impurity diffusion layer 3. Therefore, The phosphorous glass layer is removed by using hydrofluoric acid solution or the like. As a result, the semiconductor substrate 11 is obtained in which the pn junction is formed by the semiconductor substrate 2 being a first conductivity type layer made of the p-type single-crystalline silicon and the n-type impurity diffusion layer 3 being a second conductivity type layer that is formed on the light receiving surface-side of the semiconductor substrate 2.

Figures 3, 4, 5:
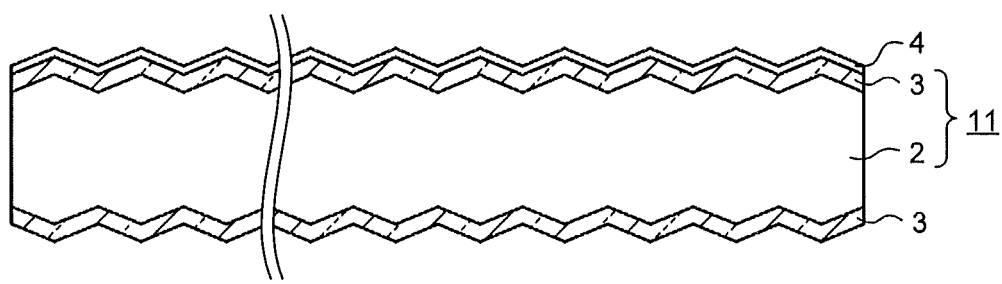

Next, for the purpose of improving a photoelectric conversion efficiency, an antireflection film 4 is formed with a uniform thickness on the light receiving surface-side (the n-type impurity diffusion layer 3) of the p-type single-crystalline silicon substrate (Step S50, FIG. 3-5). The antireflection film 4 is formed on the above-mentioned one surface-side of the p-type single-crystalline silicon substrate shown in FIG. 4-1 that is determined as the light-receiving surface by the calculation and determination unit based on the reflectance distribution and has a relatively narrower reflectance distribution.

A film thickness and a refractive index of the antireflection film 4 are so designed as to most suppress light reflection. The antireflection film 4 is formed by using a plasma CVD method, for example. For example, a silicon nitride film is formed as the antireflection film 4 by performing a low-pressure plasma CVD using mixed gas silane ($SiH_4$) gas and ammonium ($NH_3$) gas as raw material gas under a condition of a temperature of 300 degrees centigrade or higher. The refractive index is about 2.0 to 2.2, for example. An optimum thickness of the antireflection film is about 70 to 90 nanometers, for example. Note that a lamination film of two or more layers having different refractive indexes may be used as the antireflection film 4. Besides the plasma CVD method, an evaporation method, a thermal CVD method or the like can be used for forming the antireflection film 4. It should be noted that the antireflection film 4 thus formed is an insulator and just forming the light receiving surface-side electrode 12 on the antireflection film is not enough for achieving an action of a solar cell.

Next, an orientation of the light receiving surface-side electrode 12 is determined (Step S60). FIG. 5 illustrates a processed image of the light receiving surface-side of the p-type single-crystalline silicon substrate after the formation of the antireflection film 4, which is obtained by image processing by an image sensor (a color sensor) that can distinguish colors. The processed image shows an appearance state of the light receiving surface-side of the p-type single-crystalline silicon substrate after the formation of the antireflection film 4. In the example of the processed image shown in FIG. 5, a defective appearance region 42 and a defective appearance region 43 in a good appearance region 41 appear as a patchy pattern.

The defective appearance region 42 is a defective texture structure formation region, for example, where the texture structure 2*a* is not formed or a formation density of the texture structure 2*a* is lower as compared with other regions, on the light receiving surface-side of the semiconductor substrate 11 (the n-type impurity diffusion layer 3). In other words, the defective appearance region 42 is a defective appearance region that is attributed to a formation state of the texture structure 2*a*. It should be noted that the defective appearance region 42 shown in FIG. 5 corresponds to the defective appearance region 22 shown in FIG. 4-1. The defective appearance region 43 is a defective antireflection film formation region, for example, where the antireflection film 4 is not formed or the film thickness of the antireflection film 4 is different from that in the good appearance region 41. In other words, the defective appearance region 43 is a defective appearance region that is attributed to a formation state of the antireflection film 4. The good appearance region 41 is a region where the texture structure 2*a* is uniformly formed on the light receiving surface-side of the semiconductor substrate 11 (the n-type impurity diffusion layer 3). Although not shown here, there may be a region of overlap between the defective texture structure formation region and the defective antireflection film formation region.

The good appearance region 41 appears to be dark bluish color. The defective appearance region 42 and the defective appearance region 43 are different in tone or color from the good appearance region 41. The defective appearance region 43 appears to be pale bluish color (e.g. aqua) that is paler than the dark bluish color of the antireflection film 4 in the good appearance region 41. The defective appearance region 42 becomes further paler in color than the defective appearance region 43 and appears to be whitish color. Note that the defective appearance region 42 takes on various colors depending on the formation state of the texture structure 2*a*, and the defective appearance region 43 takes on various colors depending on the film thickness of the antireflection film 4.

When the light receiving surface-side electrode 12 is arranged on the antireflection film 4 where the patchy pattern with different tone or color appears as described above, it is possible by selecting an orientation of the light receiving surface-side electrode 12 to suppress deterioration in the appearance due to the patchy pattern. That is, by superimposing the light receiving surface-side electrode 12 on a larger area of the defective appearance region 42, it is possible to reduce an area of a portion where the patchy pattern is exposed after the formation of the light receiving surface-side electrode 12 and thus to suppress deterioration in the appearance. Similarly, by superimposing the light receiving surface-side electrode 12 on a larger area of the defective appearance region 43, it is possible to reduce an area of a portion where the patchy pattern is exposed after the formation of the light receiving surface-side electrode 12 and thus to suppress deterioration in the appearance.

According to the present embodiment, after the formation of the antireflection film 4, an orientation of the light receiving surface-side electrode 12 with which the appearance becomes better is determined and selected from among a plurality of orientations in which the light receiving surface-side electrode 12 is potentially arranged. For example, the color sensor is provided with an orientation determination unit. For example, the orientation determination unit superimposes a pattern data of the light receiving surface-side electrode 12 on the processed image of the light receiving surface-side of the p-type single-crystalline silicon substrate after the formation of the antireflection film 4 which is obtained by image processing by the color sensor, and thereby generates a simulation diagram regarding the orientation of the light receiving surface-side electrode 12. The simulation diagram is generated with respect to each of the plurality of orientations of the light receiving surface-side electrodes 12.

Subsequently, the orientation determination unit calculates an overlap area between the light receiving surface-side electrode 12 and the defective appearance region (the defective appearance region 42 and the defective appearance region 43), with respect to each of the simulation diagrams. Then, the orientation determination unit determines, based on the overlap areas in the respective simulation diagrams, an orientation of the light receiving surface-side electrode 12 with which the larger overlap area is obtained. It should be noted that a pattern data of the front silver bus electrode 6 may be used instead of the pattern data of the light receiving surface-side electrode 12. However, it is possible by using the pattern data of the light receiving surface-side electrode 12 to take not only the front silver bus electrode 6 but also the front silver grid electrode 5 into consideration and thus to calculate a precise area of the overlap area. It is therefore preferable to use the pattern data of the light receiving surface-side electrode 12.

Figures 3, 4, 5, 6:
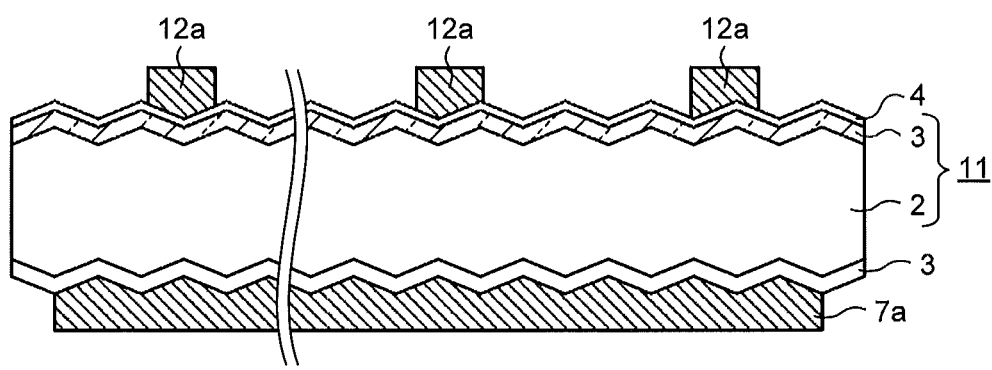
Figures 3, 4, 5, 6, 7:
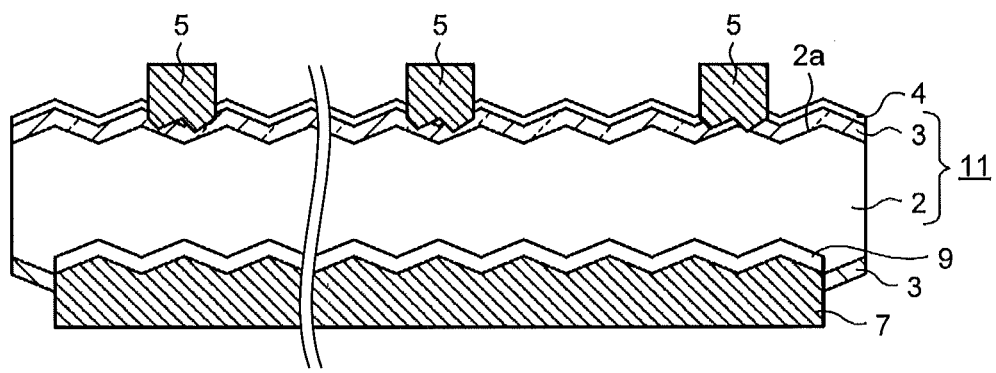
Figures 1, 4:
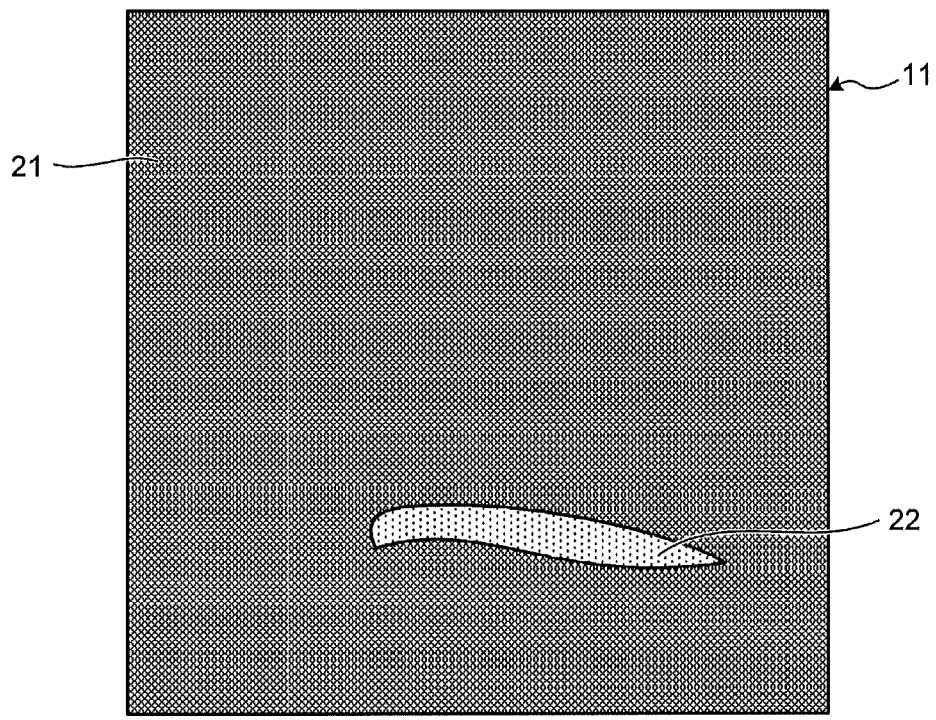
Figures 2, 4:
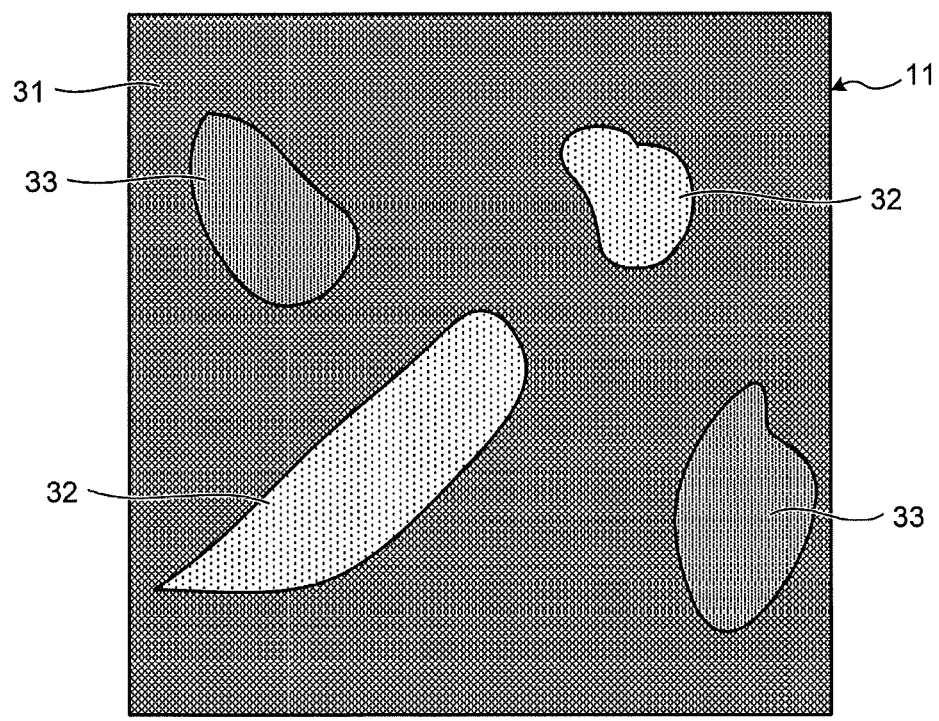
Figure 5:
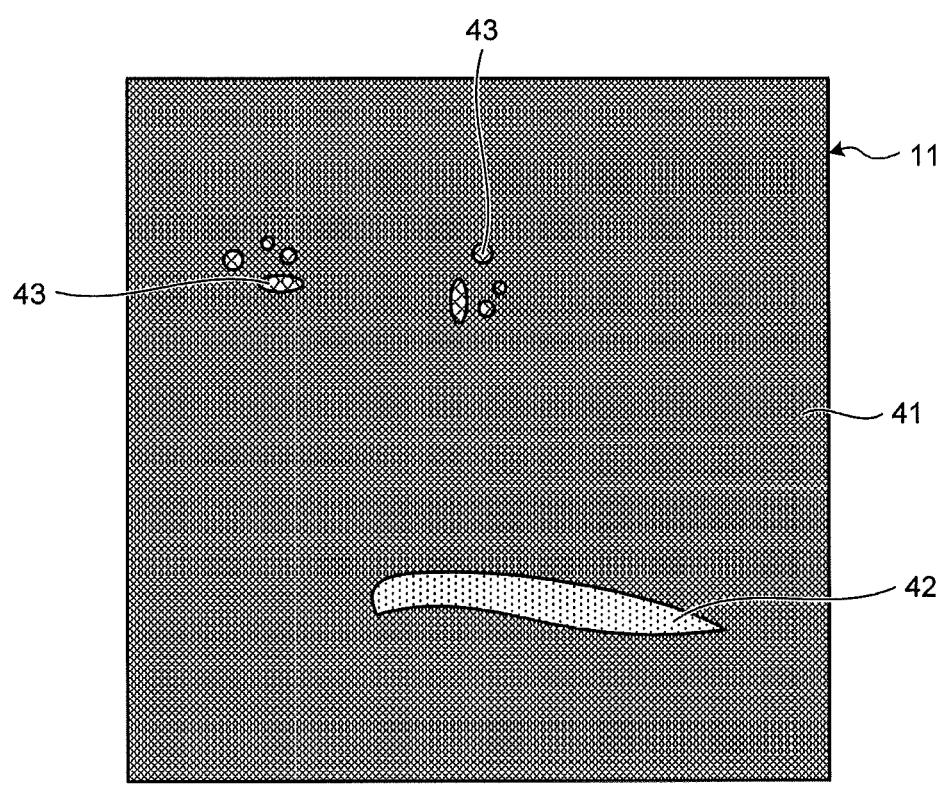
Figure 6:
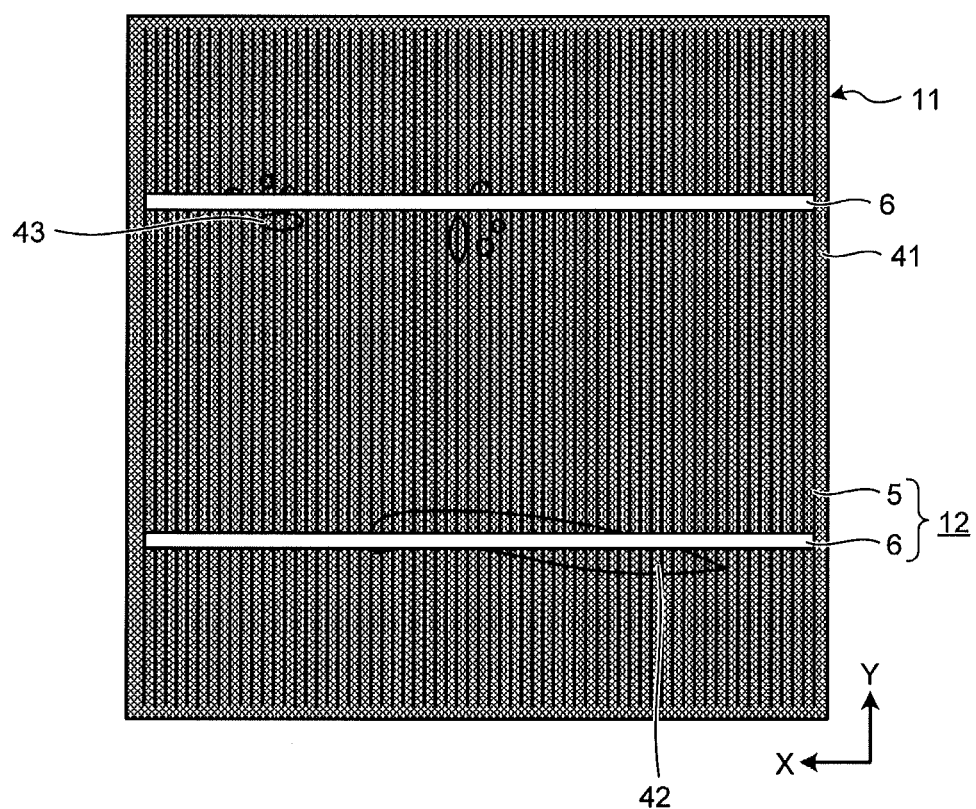
Figure 7:
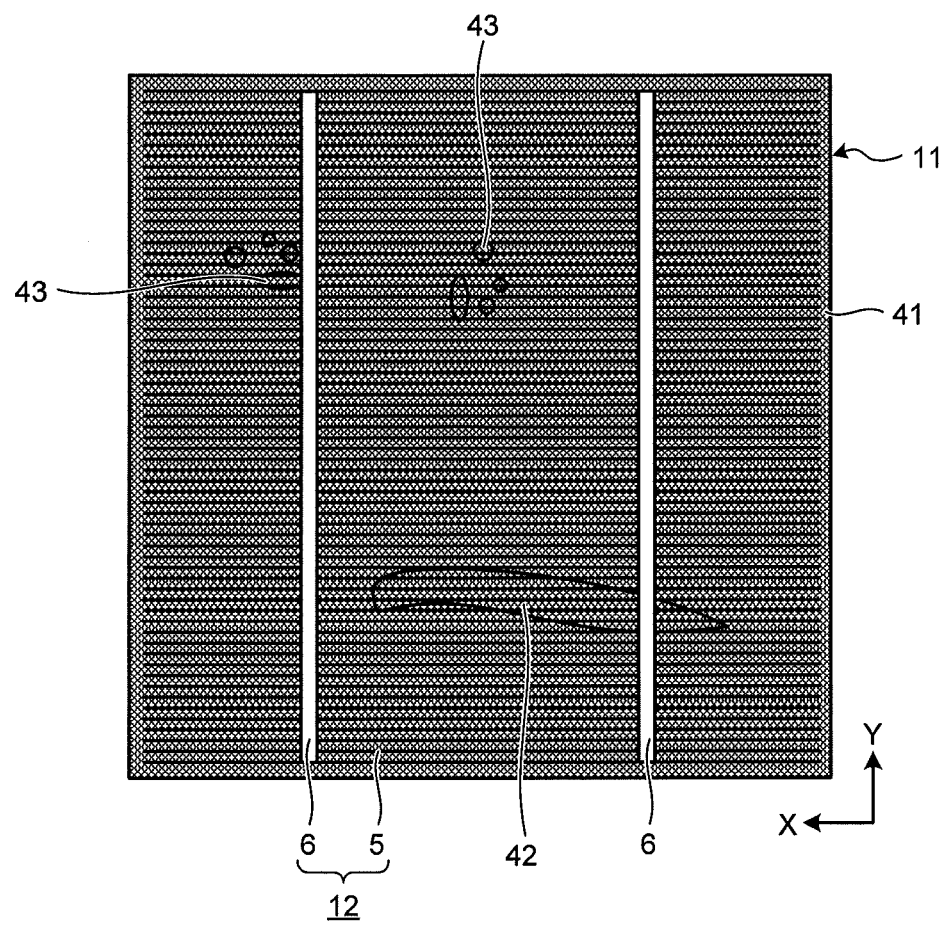

FIGS. 6 and 7 each illustrates the simulation diagram regarding the orientation of the light receiving surface-side electrode 12 on the antireflection film 4, which is generated by simulation processing in the orientation determination unit. Specifically, FIGS. 6 and 7 each illustrates the simulation diagram generated by superimposing the pattern data of the light receiving surface-side electrode 12 having a comb shape on the processed image shown in FIG. 5. In FIG. 6, the comb-shaped light receiving surface-side electrode 12 is arranged such that a longitudinal direction of the front silver bus electrode 6 is set to be a direction (X-direction in FIG. 6) parallel to a top side and a bottom side of the semiconductor substrate 11 shown in FIG. 5. In FIG. 7, the comb-shaped light receiving surface-side electrode 12 is arranged such that a longitudinal direction of the front silver bus electrode 6 is set to be a direction (Y-direction in FIG. 7) parallel to a right side and a left side of the semiconductor substrate 11 shown in FIG. 5.

The orientation determination unit calculates an overlap area between the light receiving surface-side electrode 12 and the defective appearance region (the defective appearance region 42 and the defective appearance region 43), with respect to each of the simulation diagrams shown in FIGS. 6 and 7. Then, the orientation determination unit determines, based on the overlap areas in the respective simulation diagrams, an orientation of the light receiving surface-side electrode 12 with which the larger overlap area is obtained. In the present example, the overlap area is larger in the case of the simulation diagram shown in FIG. 6 than in the case of the simulation diagram shown in FIG. 7. Therefore, the orientation determination unit determines, as the orientation of the light receiving surface-side electrode 12, "an orientation with which the longitudinal direction of the front silver bus electrode 6 is the X-direction in FIG. 6".

After the orientation of the light receiving surface-side electrode 12 is determined, electrodes are formed by screen printing. First, the light receiving surface-side electrode 12 (before firing) is fabricated. More specifically, silver paste 12a which is electrode material paste including glass flit is applied by screen printing in a shape of the front silver grid electrode 5 and the front silver bus electrode 6 on the antireflection film 4 being the light receiving surface of the p-type single-crystalline silicon substrate, and then the applied silver paste 12a is dried (Step S70, FIG. 3-6). Here, in the screen printing, an orientation of the p-type single-crystalline silicon substrate is set such that the orientation of the light receiving surface-side electrode 12 corresponds to the orientation determined at Step S60.

It should be noted that tone or color appears differently depending on reflectance on the light receiving surface-side of the p-type single-crystalline silicon substrate after the formation of the antireflection film 4. Therefore, the following processing also is possible: that is, the reflectance measurement device is used to measure the reflectance at a large number of points on the light receiving surface-side of the p-type single-crystalline silicon substrate after the formation of the antireflection film 4 and calculate a reflectance distribution based on the measurement data, and then a processed image showing an appearance state of the light receiving surface-side of the p-type single-crystalline silicon substrate after the formation of the antireflection film 4 is generated as in the case of FIG. 5.

Next, aluminum paste 7a which is electrode material paste and silver paste 8a which is electrode material paste are applied by screen printing in shapes of the back aluminum electrode 7 and the back silver electrode 8, respectively, on the back surface-side of the p-type single-crystalline silicon substrate, and then the applied aluminum paste 7a and silver paste 8a are dried (Step S80, FIG. 3-6). Note that only the aluminum paste 7a is illustrated and the silver paste 8a is not illustrated in the figure.

Next, the electrode paste on the light receiving surface-side and the back surface-side of the semiconductor substrate 11 is concurrently fired at a temperature of 600 to 900 degrees centigrade, for example. Thereby, on the front side of the semiconductor substrate 11, the antireflection film 4 is melted due to glassy material included in the silver paste 12a, the silver material comes in contact with the silicon and then coagulates again. As a result, the front silver grid electrode 5 and the front silver bus electrode 6 serving as the light receiving surface-side electrode 12 are obtained, and an electrical connection between the light receiving surface-side electrode 12 and the silicon of the semiconductor substrate 11 is established (Step S90, FIG. 3-7). Such the process is called a fire-through method.

Moreover, the aluminum paste 7a reacts with the silicon of the semiconductor substrate 11 to form the back aluminum electrode 7 and the p+ layer 9 immediately under the back aluminum electrode 7. Furthermore, the silver material of the silver paste 8a comes in contact with the silicon and then coagulates again to form the back silver electrode 8 (FIG. 3-7). Note that only the front silver grid electrode 5 and the back aluminum electrode 7 are illustrated and the front silver bus electrode 6 and the back silver electrode 8 are not illustrated in the figure.

By carrying out the processes described above, it is possible to manufacture the solar cell 1 according to the present embodiment shown in FIGS. 1-1 to 1-3. Note that the order of the application of the electrode material paste on the semiconductor substrate 11 may be interchanged between the light receiving surface-side and the back surface-side.

According to the method of manufacturing the solar cell of the present embodiment, as described above, the reflectance distributions of both surfaces of the p-type single-crystalline silicon substrate on which the texture structure is formed are measured. Then, one surface-side having the narrower reflectance distribution and a better appearance is set to be the light receiving surface-side, while the other surface-side having the wider reflectance distribution and a worse appearance is set to be the back surface-side. Then, the subsequent processes are performed to fabricate the solar cell. It is thus possible to reduce the occurrence rate of the defective appearance of the solar cell.

Furthermore, according to the method of manufacturing the solar cell of the present embodiment, the defective appearance region that is attributed to at least one of the formation state of the texture structure 2a and the formation state of the antireflection film 4 is identified in the light receiving surface-side of the p-type single-crystalline silicon substrate on which the texture structure 2a is formed. Then, the orientation of the light receiving surface-side electrode 12 is selected from among a plurality of orientations in which the light receiving surface-side electrode 12 is potentially arranged, such that a larger area of overlap between the identified defective appearance region and the pattern the light receiving surface-side electrode 12 is obtained. After that, the light receiving surface-side electrode 12 is formed. As a result, it is possible to reduce an area of a portion where the defective appearance region is exposed after the formation of the light receiving surface-side electrode 12 and thus to suppress deterioration in the appearance.

In this manner, it is possible to manufacture the solar cell having an excellent appearance by the method of manufacturing the solar cell according to the present embodiment.

Figure 8:
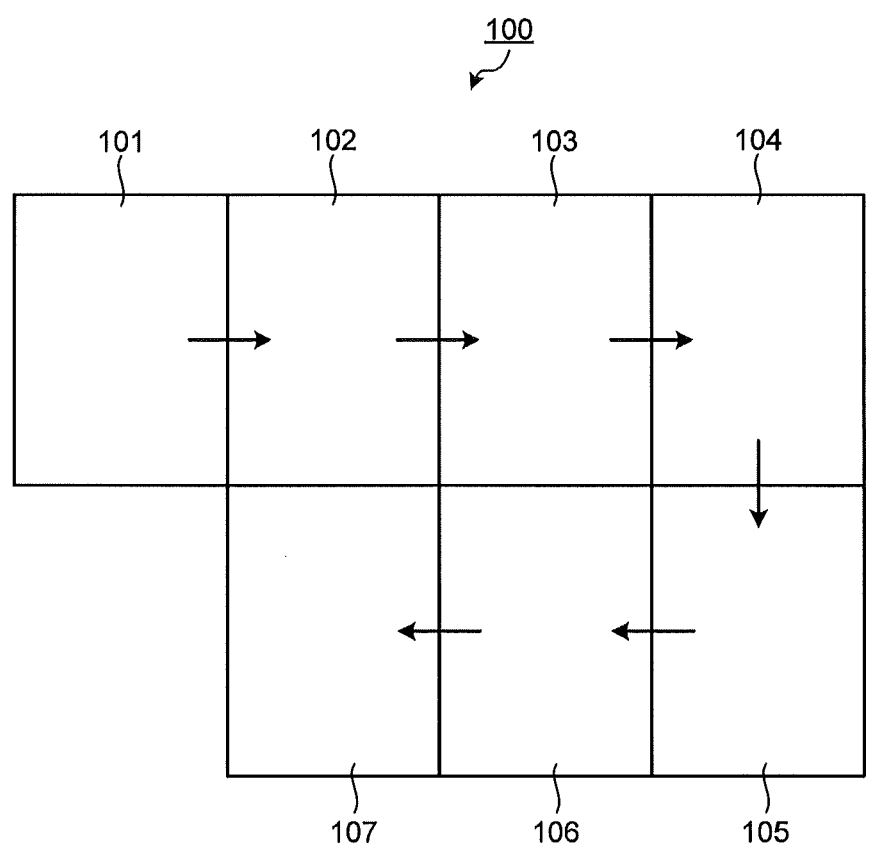
FIG. 8 is a block diagram of a schematic configuration of a solar cell manufacturing system according to the embodiment of the present invention.

FIG. 8 is a block diagram showing a schematic configuration of a solar cell manufacturing system 100 according to the present embodiment. The solar cell manufacturing system 100 manufactures a solar cell having an excellent appearance according to the above-described method of manufacturing the solar cell. The solar cell manufacturing system 100 includes a texture structure formation unit 101, a reflectance distribution measurement unit 102, an impurity diffusion layer formation unit 103, a pn separation unit 104, an antireflection film formation unit 105, a light-receiving-surface-side-electrode orientation determination unit 106, and an electrode formation unit 107.

The texture structure formation unit 101 carries out the process of Step S10 described above and forms the texture structure 2a on the surface on the light receiving surface-side of the p-type single-crystalline silicon substrate. The texture structure formation unit 101 includes: an etching tank in which etching liquid such as solution obtained by adding IPA (isopropyl alcohol) to low concentration alkali liquid is stored; a cleaning tank for performing cleaning of the p-type single-crystalline silicon substrate after the etching; and so forth.

The reflectance distribution measurement unit 102 carries out the process of Step S20 described above and determines which surface of the p-type single-crystalline silicon substrate after the formation of the texture structure 2a is used as the light receiving surface or the back surface. The reflectance distribution measurement unit 102 includes: a reflectance measurement device configured to measure the reflectance of both surfaces of the p-type single-crystalline silicon substrate on which the texture structure 2a is formed; a calculation and determination unit configured to calculate, based on a result of the measurement by the reflectance measurement device, respective reflectance distributions of the both surfaces of the p-type single-crystalline silicon substrate, and to determine, based on spreads (widths) of the reflectance distributions, the light receiving surface and the back surface; and so forth.

The impurity diffusion layer formation unit 103 carries out the process of Step S30 described above, and forms the n-type impurity diffusion layer 3 to form the pn junction. The impurity diffusion layer formation unit 103 includes a thermal diffusion furnace and so forth.

The pn separation unit 104 carries out the process of Step S40 described above and performs the pn separation. The pn separation unit 104 includes a dry etching apparatus, a laser device, and so forth.

The antireflection film formation unit 105 carries out the process of Step S50 described above and forms the antireflection film 4 on the light receiving surface-side surface of the p-type single-crystalline silicon substrate. The antireflection film formation unit 105 includes a plasma CVD apparatus and so forth.

The light-receiving-surface-side-electrode orientation determination unit 106 carries out the process of Step S60 described above and determines an orientation of the light receiving surface-side electrode 12. The light-receiving-surface-side-electrode orientation determination unit 106 includes: an image sensor (a color sensor) functioning as a defective appearance identification unit capable of distinguishing a color and performing image processing; an orientation determination unit; and so forth. For example, the orientation determination unit superimposes a pattern data of the light receiving surface-side electrode 12 on the processed image of the light receiving surface-side of the p-type single-crystalline silicon substrate after the formation of the antireflection film 4 which is obtained by image processing by the color sensor, and thereby generates the simulation diagram regarding the orientation of the light receiving surface-side electrode 12. Then, the orientation determination unit calculates an overlap area between the light receiving surface-side electrode 12 and the defective appearance region with respect to each simulation diagram, and determines, based on a result of the calculation, an orientation of the light receiving surface-side electrode 12 with which the larger overlap area is obtained.

The electrode formation unit 107 carries out the processes of Steps S70 to S90 described above and forms the light receiving surface-side electrode 12 and the back surface-side electrode 13. The electrode formation unit 107 forms the light receiving surface-side electrode 12 in the orientation determined by the light-receiving-surface-side-electrode orientation determination unit 106. The electrode formation unit 107 includes a screen printing machine, a firing furnace and so forth.

The p-type single-crystalline silicon substrate is sequentially conveyed to the respective functional units in a direction of an arrow shown in FIG. 8 and treated. A conveyer mechanism which conveys the substrate and locates the substrate in a predetermined orientation (a front-back orientation and a horizontal direction) in each apparatus is provided between the function units.

The solar cell manufacturing system 100 according to the present embodiment has such the configuration and thereby can manufacture a solar cell having an excellent appearance according to the above-described method of manufacturing the solar cell.

INDUSTRIAL APPLICABILITY

As described above, the method of manufacturing the solar cell according to the present invention is useful for manufacturing a solar cell having an excellent appearance.

REFERENCE SIGNS LIST 1 solar cell
2 semiconductor substrate
2a texture structure
3 n-type impurity diffusion layer
4 antireflection film
5 front silver grid electrode
6 front silver bus electrode
7 back aluminum electrode
7a aluminum paste
8 back silver electrode
8a silver paste
9 p+ layer (BSF (Back Surface Field))
11 semiconductor substrate
12 light receiving surface-side electrode
12a silver paste
13 back surface-side electrode
21 good appearance region
22 defective appearance region
31 good appearance region
32 defective appearance region
33 defective appearance region
41 good appearance region
42 defective appearance region
43 defective appearance region
100 solar cell manufacturing system
101 texture structure formation unit
102 reflectance distribution measurement unit
103 impurity diffusion layer formation unit
104 pn separation unit
105 antireflection film formation unit
106 light-receiving-surface-side-electrode orientation determination unit
107 electrode formation unit

The invention claimed is:

1. A manufacturing method for a solar cell comprising:
a first process of forming a texture structure on both surfaces of a semiconductor substrate of a first conductivity type;
a second process of measuring a reflectance distribution of the both surfaces of the semiconductor substrate on which the texture structure is formed;
a third process of forming an impurity diffusion layer, in which an impurity element of a second conductivity type is diffused, on one of the both surfaces of the semiconductor substrate which is narrower in the reflectance distribution;
a fourth process of forming, on the impurity diffusion layer, a light receiving surface-side electrode having a predetermined pattern and electrically connected to the impurity diffusion layer; and
a fifth process of forming a back surface-side electrode on another of the both surfaces of the semiconductor substrate which is wider in the reflectance distribution,
wherein the fourth process comprises:
identifying a first defective appearance region that is attributed to a formation state of the texture structure on a side of the one surface of the semiconductor substrate, the first defective appearance region having a shape;
determining an orientation of the light receiving surface-side electrode from among a plurality of potential orientations in which the light receiving surface-side electrode is potentially arranged, the orientation being one in which the light receiving surface-side electrode will have a larger area of overlap with the shape of the first defective appearance region than others of the plurality of potential orientations, which would have a smaller area of overlap with the shape, so that the pattern of the light receiving surface-side electrode is obtained; and forming the light receiving surface-side electrode on the side of the one surface of the semiconductor substrate according to the orientation.

2. The manufacturing method for the solar cell according to claim 1, wherein the first defective appearance region is a region on the side of the one surface of the semiconductor substrate where the texture structure is not formed or a formation density of the texture structure is lower as compared with other regions.

3. The manufacturing method for the solar cell according to claim 1, wherein the first defective appearance region is identified based on an in-plane difference in tone or color on the side of the one surface of the semiconductor substrate.

4. The manufacturing method for the solar cell according to claim 1, wherein the first defective appearance region is identified based on an in-plane reflectance distribution on the side of the one surface of the semiconductor substrate.

5. A manufacturing method for a solar cell comprising:

a first process of forming a texture structure on both surfaces of a semiconductor substrate of a first conductivity type;

a second process of measuring a reflectance distribution of the both surfaces of the semiconductor substrate on which the texture structure is formed;

a third process of forming an impurity diffusion layer, in which an impurity element of a second conductivity type is diffused, on one of the both surfaces of the semiconductor substrate which is narrower in the reflectance distribution;

a fourth process of forming, on the impurity diffusion layer, a light receiving surface-side electrode having a predetermined pattern and electrically connected to the impurity diffusion layer;

a fifth process of forming a back surface-side electrode on another of the both surfaces of the semiconductor substrate which is wider in the reflectance distribution; and forming an antireflection film on the impurity diffusion layer, between the third process and the fourth process, wherein the fourth process comprises:

identifying a second defective appearance region that is attributed to at least one of a formation state of the texture structure and a formation state of the antireflection film on a side of the one surface of the semiconductor substrate, the second defective appearance region having a shape;

determining an orientation of the light receiving surface-side electrode from among a plurality of potential orientations in which the light receiving surface-side electrode is potentially arranged, the orientation being one in which the light receiving surface-side electrode will have a larger area of overlap with the shape of the second defective appearance region than others of the plurality of potential orientations, which would have a smaller area of overlap with the shape, so that the pattern of the light receiving surface-side electrode is obtained; and forming the light receiving surface-side electrode on the side of the one surface of the semiconductor substrate according to the orientation.

6. The manufacturing method for the solar cell according to claim 5, wherein the second defective appearance region is at least any of:

a defective texture structure formation region being a region on the side of the one surface of the semiconductor substrate where the texture structure is not formed or a formation density of the texture structure is lower as compared with other regions;

a defective antireflection film formation region being a region on the side of the one surface of the semiconductor substrate where the antireflection film is not formed or a film thickness of the antireflection film is different from that in other regions; and a region of overlap between the defective texture structure formation region and defective antireflection film formation region.

7. The manufacturing method for the solar cell according to claim 5, wherein the second defective appearance region is identified based on an in-plane difference in tone or color on the side of the one surface of the semiconductor substrate.

8. The manufacturing method for the solar cell according to claim 5, wherein the second defective appearance region is identified based on an in-plane reflectance distribution on the side of the one surface of the semiconductor substrate.

9. A solar cell manufacturing system comprising:

a reflectance distribution measurement unit configured to measure a reflectance distribution of both surfaces of a semiconductor substrate of a first conductivity type on which a texture structure is formed;

an impurity diffusion layer formation unit configured to form an impurity diffusion layer, in which an impurity element of a second conductivity type is diffused, on one of the both surfaces of the semiconductor substrate which is narrower in the reflectance distribution; and an electrode formation unit configured to form, on the impurity diffusion layer, a light receiving surface-side electrode having a predetermined pattern and electrically connected to the impurity diffusion layer, and to form a back surface-side electrode on another of the both surfaces of the semiconductor substrate which is wider in the reflectance distribution, wherein the electrode formation unit comprises:

a defective appearance identification unit configured to identify a defective appearance region on a side of the one surface of the semiconductor substrate on which the impurity diffusion layer is formed and the light receiving surface-side electrode is not yet formed, the first defective appearance region having a shape; and an orientation determination unit configured to determine an orientation of the light receiving surface-side electrode from among a plurality of potential orientations in which the light receiving surface-side electrode is potentially arranged, the orientation being one in which the light receiving surface-side electrode will have a larger area of overlap with the shape of the defective appearance region than others of the plurality of potential orientations, which would have a smaller area of overlap with the shape, so that the pattern of the light receiving surface-side electrode is obtained.

10. The solar cell manufacturing system according to claim 9, further comprising an antireflection film formation unit configured to form an antireflection film on the impurity diffusion layer, wherein the defective appearance identification unit identifies the defective appearance region on the side of the one surface of the semiconductor substrate on which the impurity diffusion layer is formed, the antireflection film is further formed and the light receiving surface-side electrode is not yet formed.

11. The solar cell manufacturing system according to claim 10,
wherein the defective appearance region is at least any of:
a defective texture structure formation region being a region on the side of the one surface of the semiconductor substrate where the texture structure is not formed or a formation density of the texture structure is lower as compared with other regions;
a defective antireflection film formation region being a region on the side of the one surface of the semiconductor substrate where the antireflection film is not formed or a film thickness of the antireflection film is different from that in other regions; and
a region of overlap between the defective texture structure formation region and defective antireflection film formation region.

12. The solar cell manufacturing system according to claim 9,
wherein the defective appearance identification unit identifies the defective appearance region based on any of:
an in-plane difference in tone or color on the side of the one surface of the semiconductor substrate; and
an in-plane reflectance distribution on the side of the one surface of the semiconductor substrate.

* * * * *